US012683703B2

(12) United States Patent
Brox et al.

(10) Patent No.: US 12,683,703 B2
(45) Date of Patent: Jul. 14, 2026

(54) DATA SCRAMBLING FOR REPEAT OPERATIONS

(71) Applicant: Micron Technology, Inc., Boise, ID (US)

(72) Inventors: Martin Brox, Munich (DE); Thomas Hein, Munich (DE)

(73) Assignee: Micron Technology, Inc., Bosie, ID (US)

( * ) Notice: Subject to any disclaimer, the term of this patent is extended or adjusted under 35 U.S.C. 154(b) by 832 days.

(21) Appl. No.: 18/059,228

(22) Filed: Nov. 28, 2022

(65) Prior Publication Data

US 2023/0198652 A1 Jun. 22, 2023

Related U.S. Application Data

(60) Provisional application No. 63/265,511, filed on Dec. 16, 2021.

(51) Int. Cl.
| | |
|---|---|
| *H04J 13/10* | (2011.01) |
| *G06F 11/10* | (2006.01) |
| *G11C 7/10* | (2006.01) |
| *H04J 13/00* | (2011.01) |

(52) U.S. Cl.
CPC .......... *H04J 13/10* (2013.01); *G06F 11/1004* (2013.01); *G11C 7/1006* (2013.01)

(58) Field of Classification Search
CPC ..... G11C 7/1006; H04J 13/10; G06F 11/1004
See application file for complete search history.

(56) References Cited

U.S. PATENT DOCUMENTS

| | | | | |
|---|---|---|---|---|
| 8,989,171 | B2 * | 3/2015 | Zwart | H04L 1/1692 |
| | | | | 370/479 |
| 9,294,316 | B2 * | 3/2016 | Schmidl | H04L 25/03866 |
| 10,038,523 | B2 * | 7/2018 | Gunderson | H04L 25/4908 |
| 10,291,365 | B2 * | 5/2019 | Moision | H04B 10/1123 |
| 10,700,812 | B2 * | 6/2020 | Matsuda | H04L 5/0057 |
| 11,134,493 | B2 * | 9/2021 | Zhang | H04L 1/1845 |
| 11,165,444 | B2 * | 11/2021 | Dodds | H04L 9/0618 |
| 2009/0274301 | A1 * | 11/2009 | Otte | H04L 25/03866 |
| | | | | 380/270 |
| 2020/0107325 | A1 * | 4/2020 | Zhang | H03M 13/1111 |
| 2021/0242964 | A1 * | 8/2021 | Shilo | H04L 1/1812 |
| 2023/0168813 | A1 * | 6/2023 | Bueb | G06F 3/0619 |

* cited by examiner

Primary Examiner — Justin R Knapp
(74) *Attorney, Agent, or Firm* — Holland & Hart LLP

(57) ABSTRACT

Methods, systems, and devices for data scrambling for repeat operations are described. A first device may communicate a data set to a second device as a first set of bits. The first device may use a first scrambling code to scramble the first set of bits and the second device may use a first descrambling code to descramble the first set of bits. Upon determining that the first set of bits was received by the second device with an error, the first device may communicate the data set to the second device as a second set of bits. The first device may use a second scrambling code to scramble the second set of bits and the second device may use a second descrambling code to descramble the second set of bits.

18 Claims, 9 Drawing Sheets

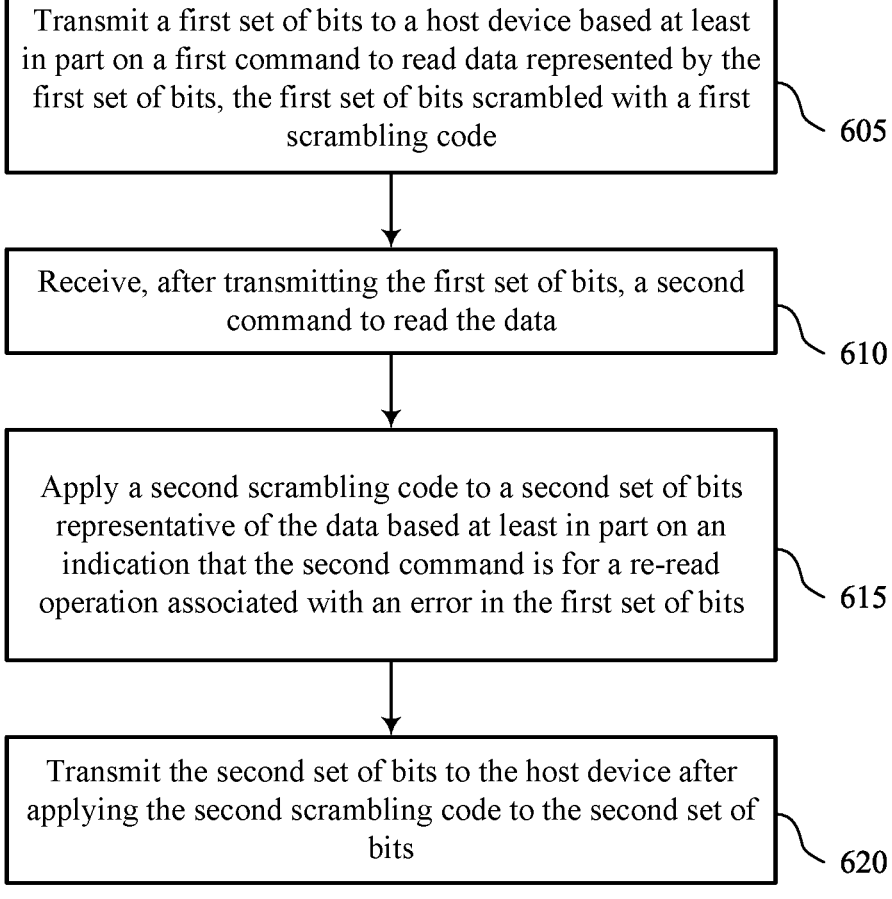

Transmit a first set of bits to a host device based at least in part on a first command to read data represented by the first set of bits, the first set of bits scrambled with a first scrambling code

605

Receive, after transmitting the first set of bits, a second command to read the data

610

Apply a second scrambling code to a second set of bits representative of the data based at least in part on an indication that the second command is for a re-read operation associated with an error in the first set of bits

615

Transmit the second set of bits to the host device after applying the second scrambling code to the second set of bits

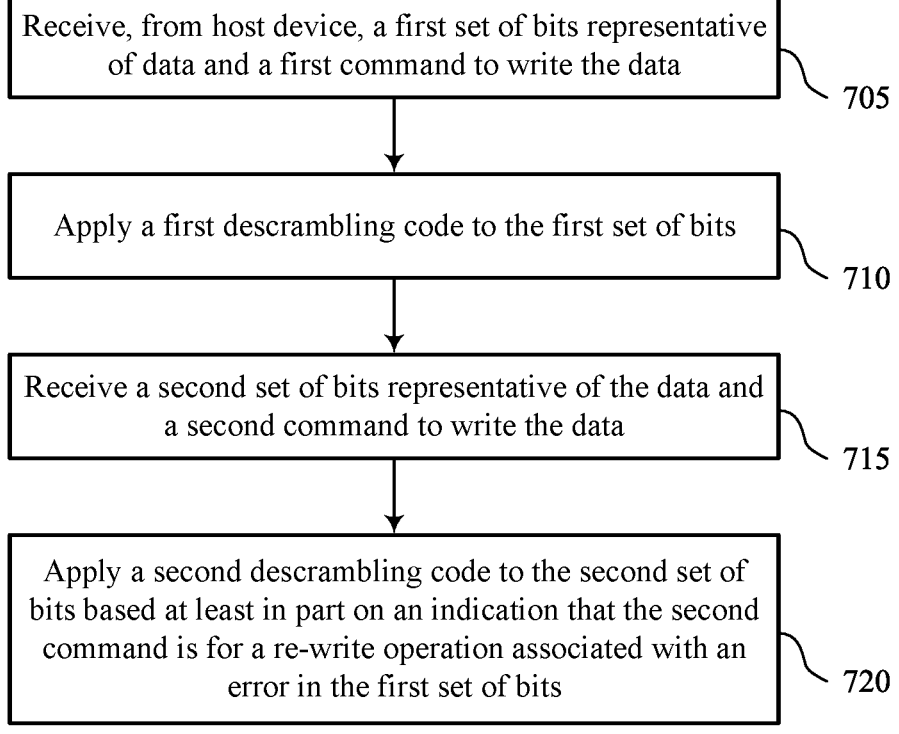

Receive, from host device, a first set of bits representative of data and a first command to write the data    705

Apply a first descrambling code to the first set of bits    710

Receive a second set of bits representative of the data and a second command to write the data    715

Apply a second descrambling code to the second set of bits based at least in part on an indication that the second command is for a re-write operation associated with an error in the first set of bits    720

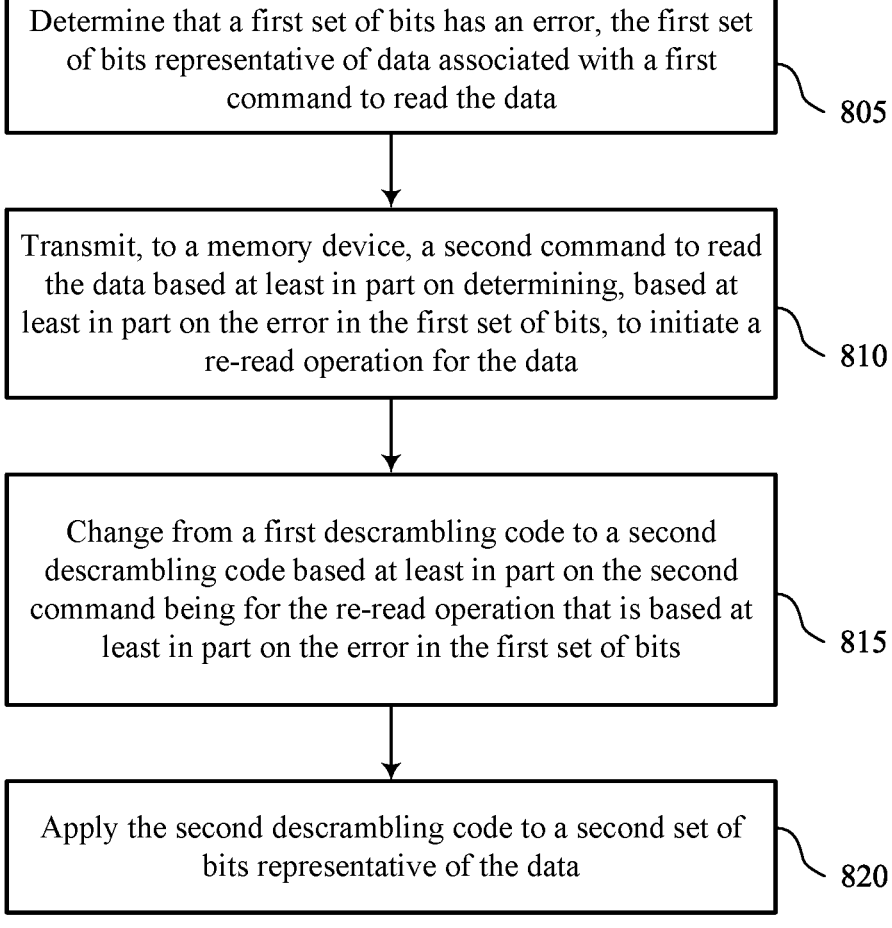

Determine that a first set of bits has an error, the first set of bits representative of data associated with a first command to read the data

805

Transmit, to a memory device, a second command to read the data based at least in part on determining, based at least in part on the error in the first set of bits, to initiate a re-read operation for the data

810

Change from a first descrambling code to a second descrambling code based at least in part on the second command being for the re-read operation that is based at least in part on the error in the first set of bits

815

Apply the second descrambling code to a second set of bits representative of the data

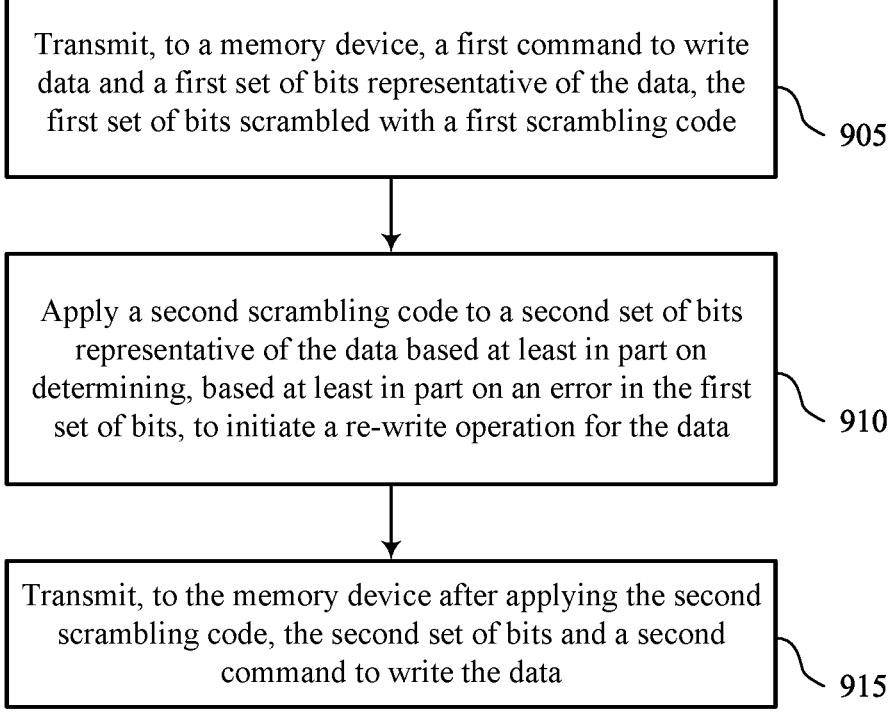

Transmit, to a memory device, a first command to write data and a first set of bits representative of the data, the first set of bits scrambled with a first scrambling code

905

Apply a second scrambling code to a second set of bits representative of the data based at least in part on determining, based at least in part on an error in the first set of bits, to initiate a re-write operation for the data

910

Transmit, to the memory device after applying the second scrambling code, the second set of bits and a second command to write the data

DATA SCRAMBLING FOR REPEAT OPERATIONS

CROSS REFERENCE

The present application for patent claims the benefit of U.S. Provisional Patent Application No. 63/265,511 by BROX et al., entitled "DATA SCRAMBLING FOR REPEAT OPERATIONS," filed Dec. 16, 2021, assigned to the assignee hereof, and expressly incorporated by reference herein.

FIELD OF TECHNOLOGY

The following relates to one or more systems for memory, including data scrambling for repeat operations.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

BRIEF DESCRIPTION OF THE DRAWINGS

FIGS. 6 through 9 show flowcharts illustrating a method or methods that support data scrambling for repeat operations in accordance with examples as disclosed herein.

DETAILED DESCRIPTION

A system may include a host device that is coupled with a memory device. The host device may store information, such as data, at the memory device. Thus, data may be communicated between the host device and the memory device. But in some examples, the data communicated between the host device and the memory device may be unintentionally altered during communication (e.g., during transmission along the system bus), resulting in receipt of incorrect data. To obtain the correct data, the originating device may re-transmit the data. However, re-transmission of the data may still result in transmission error(s), an issue that may be exacerbated for patterns of data that are more susceptible to transmission errors than others. In such a scenario, the same data may be transmitted multiple (e.g., many) times before the data is successfully received (if it is successfully received at all), which may reduce system throughput, latency, and efficiency, among other disadvantages.

According to the techniques described herein, a system may improve performance by using different scrambling codes for initial transmissions and re-transmissions. For example, an originating device may use a first scrambling code for an initial transmission of data and, in the event of a re-transmission of the data, may use a second (e.g., different) scrambling code for the re-transmission. Because scrambling a set of data can change the pattern of the data, using a different scrambling code for a re-transmission of data (relative to the initial transmission) may increase the likelihood that the data is received error-free. Thus, the system may reduce the quantity of retransmissions used to provide correct data between devices. However, to reduce complexity, the originating device may continue to use the scrambling code from the latest re-transmission for subsequent transmissions (as opposed to changing scrambling codes for each transmission).

Features of the disclosure are initially described in the context of systems and dies as described with reference to FIG. 1. Features of the disclosure are described in the context of process flows as described with reference to FIGS. 2 and 3. These and other features of the disclosure are further illustrated by and described with reference to an apparatus diagram and flowcharts that relate to data scrambling for repeat operations as described with reference to FIGS. 4-9.

Figure 1:
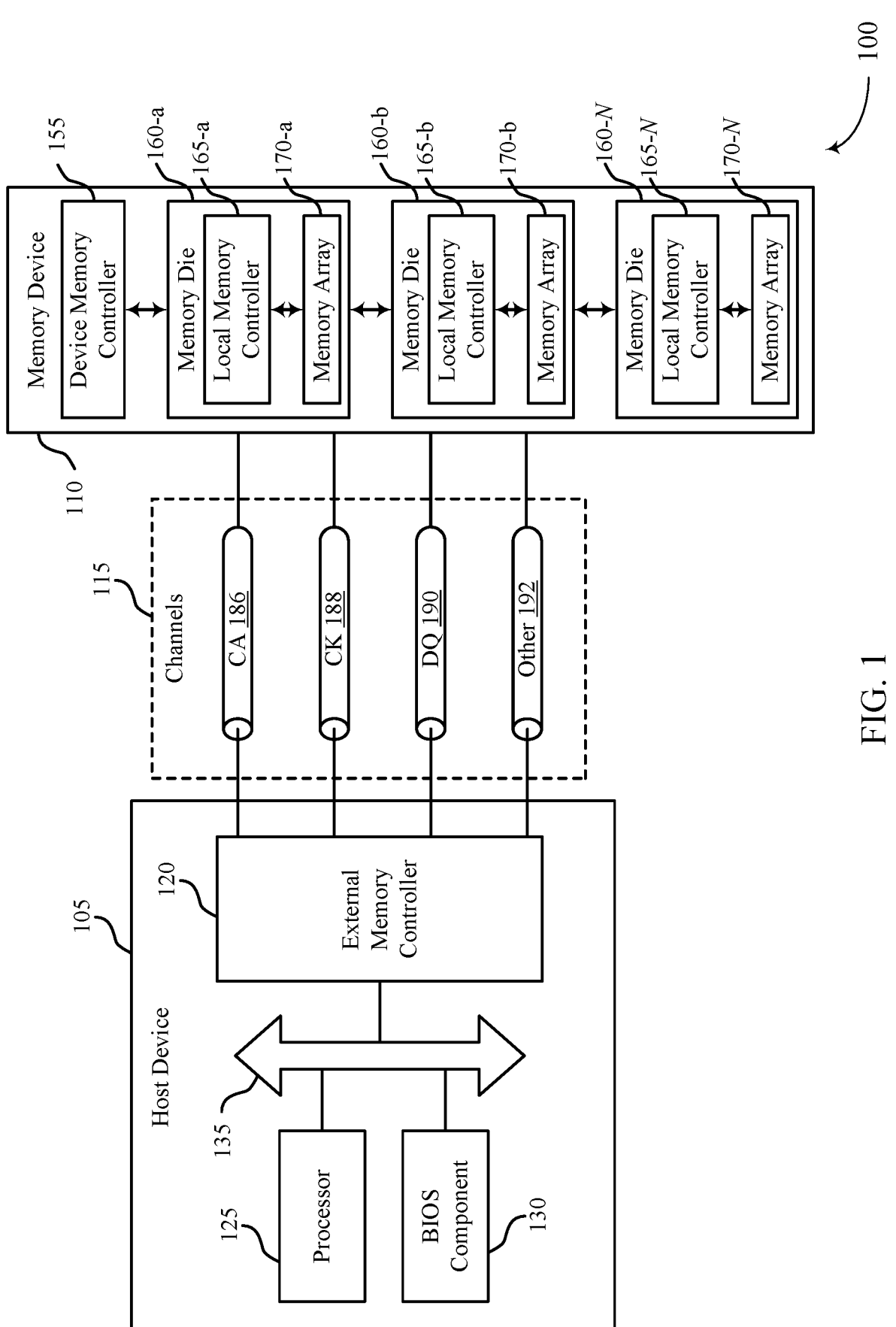
FIG. 1 illustrates an example of a system that supports data scrambling for repeat operations in accordance with examples as disclosed herein.

FIG. 1 illustrates an example of a system 100 that supports data scrambling for repeat operations in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission media that carry information between the host device 105 and the memory device. Each channel 115 may include one or more signal paths or transmission media (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the devices in the system 100 may use an error detection scheme, such as a cyclic redundancy check (CRC) scheme, to detect errors that occur in data during transmission between the devices. As part of the CRC scheme, an originating device may compute one or more CRC bits based on the set of data to be transmitted. In some examples, the CRC bits for a set of data may be remainder bits calculated by dividing the set of data by a polynomial. The originating device may append the CRC bits for a set of data to the set of data (or otherwise communicate the CRC bits with the set of data) so that the recipient device can use the CRC bits to determine whether the set of data incurred any error during transmission. For example, the recipient device may generate a new set of CRC bits for the set of data and compare the new set of CRC bits to the received set of CRCs bits. If there is a mismatch between the new set of CRC bits and the received set of CRC bits, the recipient device may determine that the data incurred one or more errors during transmission. Other techniques for using CRC bits to determine errors in data are contemplated and within the scope of this disclosure. Although described with reference to CRC bits, other error detection bits (e.g., parity bits) may be used for error detection.

Use of a CRC scheme (or other error detection scheme) may allow a device to determine whether a set of data incurred any errors during transmission. Upon determining that a set of data has been received with an error, the device may initiate a re-transmission of the set of data. But re-transmitting the set of data may be unsuccessful if the set of data has the same pattern as in the initial transmission (e.g., a pattern that is susceptible to transmission errors), which may occur if the same scrambling code is used relative to the initial transmission. According to the techniques described herein, the system 100 may improve transmission reliability by using different scrambling codes for initial transmissions and re-transmissions. For example, if the originating device uses a first scrambling code to scramble a set of data for an initial transmission, the originating device may use a second different scrambling code to scramble the set of data for a re-transmission so that the set of data has a different pattern (e.g., one that is less susceptible to transmission errors) for the re-transmission. Scrambling a set of data may include applying a scrambling code to the set of data and may also be referred to as encoding the set of data.

To facilitate the use of different scrambling codes for an initial transmission and a re-transmission, the host device 105 may indicate to the memory device 110 whether an access command (e.g., a read command, a write command) is for a non-repeat operation on a set of data (e.g., a non-re-read operation, a non-re-write operation) or a repeat operation on the set of data (e.g., a re-read operation, a re-write operation). A non-re-read operation, which may also be referred to as an initial read operation, may refer to a read operation for a set of data that is not triggered by an error in a previous read operation for the set of data. A non-re-write operation, which may also be referred to as an initial write operation, may refer to a write operation for a set of data that is not triggered by an error in a previous write operation for the set of data. A re-read operation may refer to a read operation for the same data associated with a previous read operation and may be triggered by an error in the data during the previous read operation. A re-write operation may refer to a write operation for the same data associated with a previous write operation and may be triggered by an error in the data during the previous write operation. Re-read operations and re-write operations may also be referred to as replay operations.

In some examples, the host device 105 may indicate that an access command (e.g., a read command, a write command) is for a repeat operation by including a flag (e.g., a bit) in the access command. A first value of the bit may be associated with non-repeat operations (e.g., non-re-read operations, non-re-write operations) and a second value of the bit may be associated with repeat operations (e.g., re-read operations, re-write operations). A read command with a bit equal to the second value may be referred to as a re-read command and a write command with a bit equal to the second value may be referred to as a re-write command. Relative to other techniques, using a bit in an access command to indicate repeat operations may reduce signaling overhead.

Alternatively, the host device 105 may precede the access command with transmitting another command to program a bit at the memory device 110 that indicates whether incoming commands are non-repeat commands or repeat commands. The bit may, in some examples, be in a register (e.g., a mode register) of the memory device 110 or may be stored in a local array or latch of the memory device 110, among other examples. A first value of the register bit may be associated with non-repeat operations (e.g., non-re-read operations, non-re-write operations) and a second value of the bit may be associated with repeat operations (e.g., re-read operations, re-write operations). Relative to other techniques, using a register bit to indicate repeat operations may reduce the number of bits used for an access command (or conserve header bits of the access command for other uses).

In some examples, a re-transmission of a set of data may still incur one or more transmission errors even though a different scrambling code was used relative to the initial transmission. In such an example, the originating device may perform a second retransmission of the set of data using yet another different scrambling code. So, a device may be configured to change scrambling codes for a re-transmission. However, the device may continue to use the same scrambling code until another re-transmission occurs. For example, after using a scrambling code for a re-transmission, the device may receive an access command for a non-repeat operation and use that same scrambling code (that was previously used for the re-transmission) for data associated with the access command based on the access command being for non-re-transmission operation, such as a non-repeat operation. Selectively changing scrambling codes for re-transmissions, as described herein, may reduce complexity and power consumption relative to other techniques including those that change scrambling codes for every transmission, regardless of transmission type.

So, in some scenarios, a set of data may be re-transmitted multiple times with different scrambling codes. To ensure that the recipient device is able to de-scramble a scrambled set of data, the recipient device and originating device may be configured to use the same respective scrambling code(s) for the set of data. If used for descrambling, a scrambling code may be referred to as a descrambling code. For example, the recipient device and the originating device may be configured with respective scrambler circuits that are configured to generate identical one or more scrambling codes for a given re-transmission. In some examples, a scrambler circuit may be or include linear-feedback shift register (LFSR) whose output is based on a linear function of its previous state. Thus, scrambling may be based on a symbol from codebook that is defined between the originating device and the recipient device and may change for each re-transmission (e.g., based on a predefined LFSR).

Figure 2:
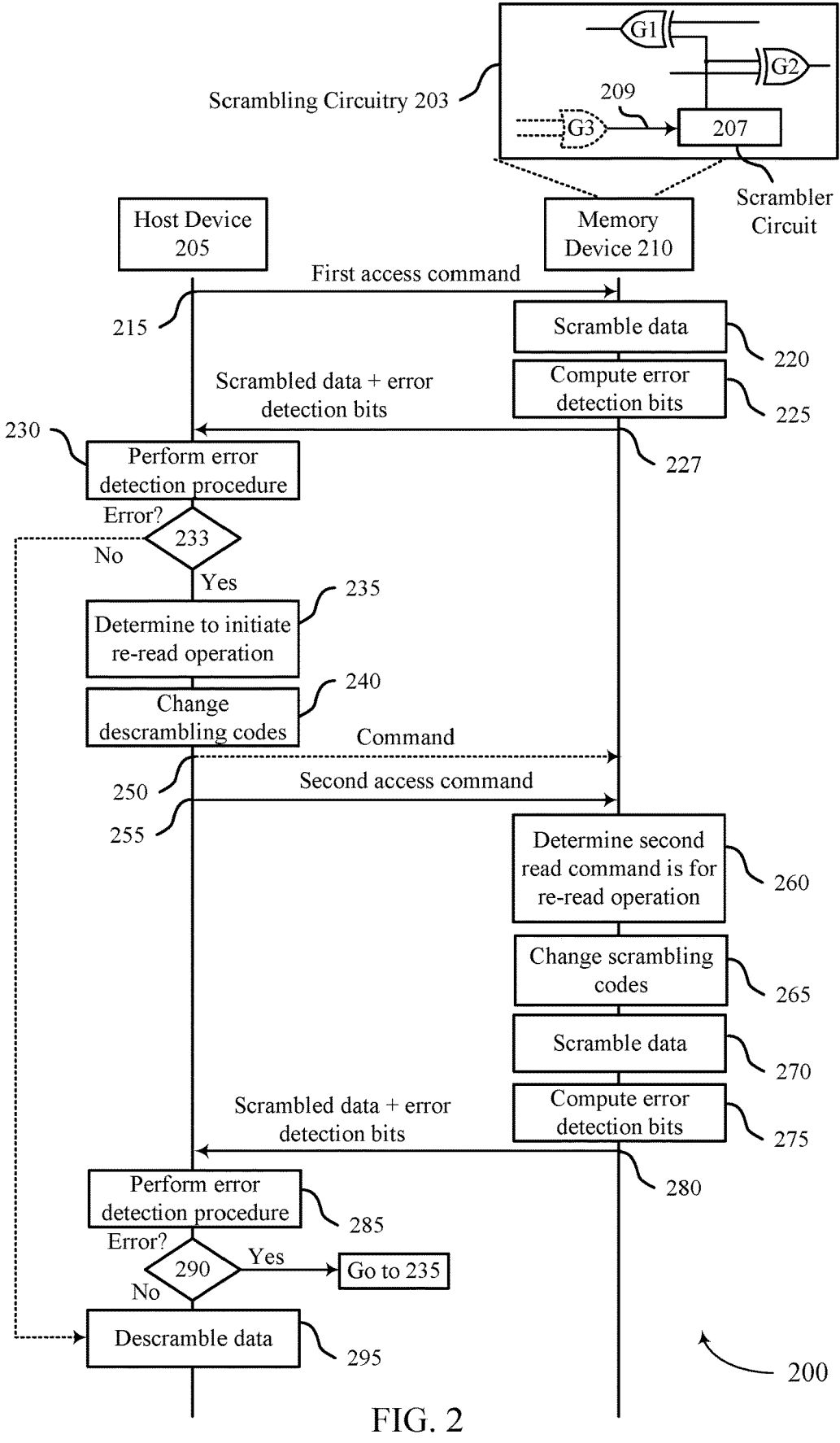
FIG. 2 illustrates an example of a process flow that supports data scrambling for repeat operations in accordance with examples as disclosed herein.

FIG. 2 illustrates an example of a process flow that supports data scrambling for repeat operations in accordance with examples as disclosed herein. The process flow 200 may be implemented by a host device 205 and a memory device 210, which may be examples of a host device 105 and a memory device 110, respectively, as described with reference to FIG. 1. The host device 205 and the memory device 210 may be configured to support the use of different scrambling codes for re-transmissions.

The host device 205 and the memory device 210 may each include a respective scrambler circuit that is configured to perform scrambling and de-scrambling. For ease of illustration, a scrambling circuitry 203 is illustrated with respect to memory device 210; however, a similar scrambler circuit may be included in the host device 205. The scrambling circuitry 203 may include a scrambler circuit 207, which may be or include shift register, such as an LFSR. The scrambler circuit 207 may be configured to output a different scrambling code (e.g., a set of n bits) in response to a control signal 209. For example, the scrambler circuit 207 may be configured to change scrambling codes each time the control signal 209 is toggled or asserted. The scrambling codes output by the scrambler circuit 207 may be pseudo-random scrambling codes and, for a given transmission, may match the scrambling code used by the host device 205. For example, if the memory device 210 uses a scrambling code to scramble a set of data for transmission, the host device 205 may the same scrambling code to descramble the set of data, and vice versa.

The control signal 209 may be generated based on the value of the re-read flag in the mode register of the memory device 210, where the repeat flag refers to the register bit that indicates whether incoming commands are initial access commands or repeat access commands. Alternatively, the control signal 209 may be generated based on one or more received repeat access commands (e.g., a re-read commands, a re-write command). For example, the control signal 209 may be generated by logic gate G3 (which may be a logic OR gate), which may be configured to receive an indication of a re-read command as a first input and configured to receive an indication of a re-write command as a second input.

The scrambler circuit 207 may output a scrambling code to one or more logic gates that apply the scrambling code to a set of data, which may also be referred to as a data stream or a data sequence. For example, the memory device 210 may use the logic gate G1 (e.g., a logic XOR gate) to scramble data for transmission to the host device 205. The logic gate G1 may be configured to apply a scrambling code to a set of data by performing logic operations (e.g., logic XOR operations) on the bits in the set of data and the bits in the scrambling code. The memory device 210 may use the logic gate G2 (e.g., a logic XOR gate) to descramble data received from the host device 205. The logic gate G2 may be configured to apply a scrambling code (also referred to as a descrambling code) to a set of data by performing logic operations (e.g., logic XOR operations) on the bits in the set of data and the bits in the scrambling code. Use of the scrambling code as a descrambling code may allow the memory device 210 to descramble a set of data that was scrambled using the scrambling code.

The host device 205 and the memory device 210 may use respective scrambler circuits to perform the scrambling operations described herein.

At 215, the host device 205 may transmit a first access command (e.g., a first read command) to the memory device 210. The first access command may be associated with a data set and may indicate a read operation. In response to the first access command, the memory device 210 may retrieve the data set from memory. At 220, the memory device 210 may scramble a first set of bits that is representative of the data set. For example, the memory device 210 may (e.g., via the scrambling circuitry 203) apply a first scrambling code to the first set of bits.

At 225, the memory device 210 may compute error detection bits (e.g., CRC bits) for the scrambled first set of bits. Computing the error detection bits may also be referred to as calculating error correction bits or generating error detection bits. In some examples, the memory device 210 may compute the error detection bits as the remainder of a division of the scrambled first set of bits by a polynomial. Thus, the error detection bits computed by the memory device 210 may be based on the scrambled first set of bits. Although described with reference to CRC bits, other type of error detection bits (e.g., parity bits) may be used to detect errors in transmitted data.

At 227, the memory device 210 may transmit the scrambled first set of bits and the error detection bits (e.g., CRC bits), to the host device 205. At 230, the host device 205 may perform an error detection procedure, such as a CRC procedure, to determine whether the scrambled first set of bits has been received error-free. The error detection procedure may involve the error detection bits and the scrambled first set of bits. For example, the host device 205 may compute a local set of error detection bits based on scrambled first set of bits and compare the local set of error detection bits to the received error detection bits.

At 233, the host device 205 may, based on the error detection procedure (e.g., the CRC procedure), determine whether the scrambled first set of bits was received with an error. The host device 205 may determine whether the scrambled first set of bits was received with an error based on a comparison of the local set of error detection bits with the received error detection bits.

If the host device 205 determines that the scrambled first set of bits was received error-free (e.g., the local set of error detection bits are equal to the received error detection bits), the host device 205 may proceed to 295 and descramble the scrambled first set of bits using a first descrambling code. However, if the host device 205 determines that the scrambled first set of bits was received with an error (e.g., the local set of error detection bits are not equal to the received error detection bits), the host device 205 may proceed to 235.

At 235, the host device 205 may determine to initiate a re-read operation for the data set. The host device 205 may determine to initiate the re-read operation based on determining that the first set of bits was received with an error. At 240, the host device 205 may change descrambling codes. For example, the host device 205 may change from a first descrambling code to a second descrambling code. The host device 205 may change descrambling codes based on determining to initiate the re-read operation. Put another way, the host device 205 may change descrambling codes based on detecting the error in the scrambled first set of bits.

At 250, the host device 205 may transmit a command, which may be referred to as a query command, that prompts the memory device 210 to modify a value of the repeat flag in a register (or other component) at the memory device 210. The repeat flag may be a bit that indicates whether a received access command is for a repeat operation (e.g., a re-read operation, a re-write operation). For example, if the repeat flag has a first value, the re-repeat flag may indicate that a received access command is for a non-repeat operation (e.g., a non-re-read operation, a non-re-write operation). If the repeat flag has a second value, the repeat flag may indicate that a received access command is for a repeat operation (e.g., a re-read operation, a re-write operation). The repeat flag may be automatically cleared (e.g., reset to the first value) after a threshold duration of time has expired (e.g., relative to setting the flag) or may be cleared in response to a second command from the host device 205.

At 255, the host device 205 may transmit a second access command (e.g., a read command) to the memory device 210. The second access command may be associated with the data set and may indicate a read operation. The second access command may also be referred to as an access command, a replay command, or other suitable terminology. In some examples (e.g., if the host device 205 does not transmit the command at 250), the second access command may include a flag (e.g., a bit) that indicates the second access command is for a repeat operation (e.g., a re-read operation).

At 260, the memory device 210 may determine that the second access command is for a re-read operation. In a one example (e.g., if the host device 205 transmits the command at 250), the memory device 210 may determine that the second access command is for a re-read operation based on the value of the repeat flag. In another example (e.g., if the host device 205 does not transmit the command at 250), the memory device 210 may determine that the second access command is for a re-read operation based on the flag included in the second access command.

At 265, the memory device 210 may change from the first scrambling code to the second scrambling code. The memory device 210 may change from the first scrambling code to the second scrambling code based on the second access command being for a re-read operation that is associated with an error in the first set of data bits. In one example (e.g., if the host device 205 does not transmit the command at 250), the memory device 210 may change scrambling codes by providing an indication of the second access command for the re-read operation to the logic gate G3 so that the control signal 209 output by the logic gate G3 causes the scrambler circuit 207 to cycle to the next scrambling code. In another example (e.g., if the host device 205 does not transmit the command at 250), the memory device 210 may change scrambling codes by asserting the control signal 209 based on the value of the repeat flag.

At 270, the memory device 210 may scramble a second set of bits that is representative of the data set. For example, the memory device 210 may (e.g., via the scrambling circuitry 203) apply a second scrambling code to the second set of bits. Thus, the memory device 210 may use different scrambling codes for the initial transmission and the re-transmission for the data set. In some examples, the second scrambling code may invert the second set of bits, which may reduce complexity relative to more complex scrambling codes. However, a more complex scrambling code may provide stronger protection against transmission errors.

At 275, the memory device 210 may compute error detection bits (e.g., CRC bits) for the scrambled second set of bits. In some examples, the memory device 210 may compute the error detection bits as the remainder of a division of the scrambled second set of bits by a polynomial. Thus, the error detection bits computed by the memory device 210 may be based on the scrambled second set of bits.

At 280, the memory device 210 may send the scrambled first set of bits and the error detection bits to the host device 205. At 285, the host device 205 may perform an error detection procedure, such as a CRC procedure, to determine whether the scrambled second set of bits has been received error-free. The error detection procedure may involve the error detection bits received at 280 and the scrambled second set of bits. For example, the host device 205 may compute a local set of error detection bits (e.g., CRC bits) based on scrambled second set of bits and compare the local set of error detection bits to the received error detection bitts.

At 290, the host device 205 may, based on the error detection procedure, determine whether the scrambled second set of bits was received with an error. The host device 205 may determine whether the scrambled second set of bits was received with an error based on a comparison of the local error detection bits with the received error detection bits.

If the host device 205 determines that the scrambled second set of bits was received error-free (e.g., the local set of error detection bits are equal to the received error detection bits), the host device 205 may proceed to 295. However, if the host device 205 determines that the scrambled second set of bits was received with an error (e.g., the local set of error detection bits are not equal to the received error detection bits), the host device 205 may proceed to 235 and repeat the operations of the process flow 200.

At 295, the host device 205 may descramble the scrambled second set of bits using the second descrambling code. For example, the host device 205 may (e.g., via scrambling circuitry) apply the second descrambling code to the scrambled second set of bits to descramble the scrambled second set of bits. Thus, the host device 205 may use the second descrambling code (rather than the first descrambling code) based on the scrambled second set of bits being for the re-read operation. The second descrambling code may be same as the second scrambling code.

Thus, the host device 205 and the memory device 210 may use of different scrambling codes for re-transmissions. If the memory device 210 receives another access command after 295, the memory device 210 may use the second scrambling code for scrambling (or descrambling) data associated with the access command if the access command is for a non-repeat operation (e.g., a non-re-read operation, a non-re-write operation). For example, the memory device 210 may use the second scrambling code if the repeat flag has the first value or if the access command has a flag (e.g., a bit) that indicates the access command is for a non-repeat operation (e.g., a non-re-read operation, a non-re-write operation).

To prevent the operations of the process flow 200 from repeating endlessly (e.g., in a loop), the host device 205 may count the quantity of times a re-read operation is performed for the same data set. If a threshold quantity of re-read operations for the same data set is performed, the host device 205 may flag the data set as having a fatal error and exit the process flow 200 (e.g., refrain from performing any addition re-read operations for the data set).

Alternative examples of the foregoing may be implemented, where some operations are performed in a different order than described, are performed in parallel (e.g., at partially or wholly overlapping times), or are not performed at all. In some cases, operations may include additional features not mentioned herein, or further operations may be added.

Figure 3:
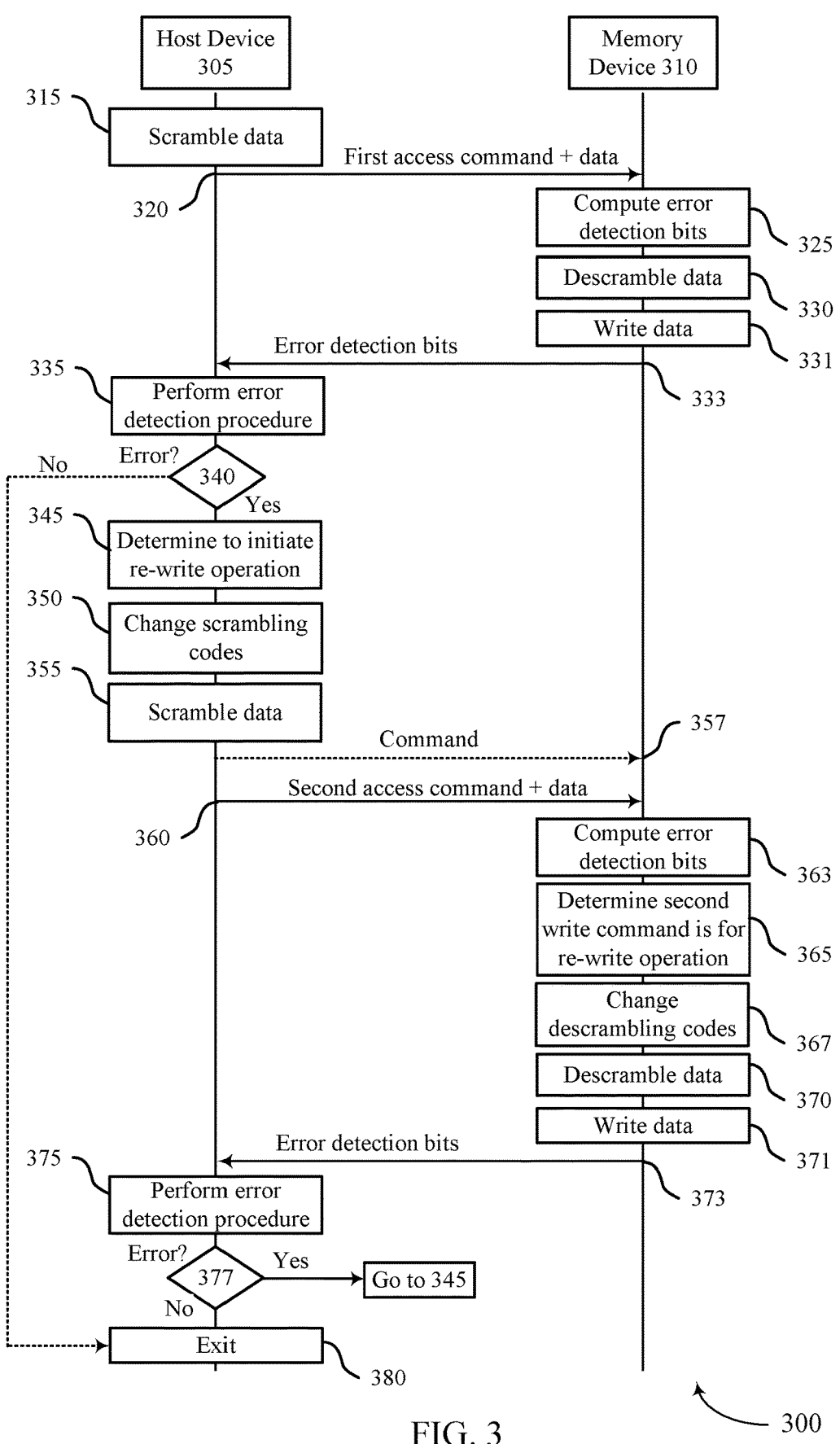
FIG. 3 illustrates an example of a process flow that supports data scrambling for repeat operations in accordance with examples as disclosed herein.

FIG. 3 illustrates an example of a process flow 300 that supports data scrambling for repeat operations in accordance with examples as disclosed herein. The process flow 300 may be implemented by a host device 305 and a memory device 310. The host device 305 may be an example of a host device 105 or a host device 205 as described with reference to FIGS. 1 and 2, respectively. The memory device 310 may be an example of a memory device 110 or a memory device 210 as described with reference to FIGS. 1 and 2, respectively. The host device 305 and the memory device 310 may be configured to support the use of different scrambling codes for re-transmissions. The host device 305 and the memory device 310 may use respective scrambler circuits (e.g., as described with reference to FIG. 2) to perform the scrambling operations described herein.

At 315, the host device 305 may scramble a first set of bits. For example, the host device 305 may (e.g., via scrambling circuitry) apply a first scrambling code to the first set of bits. The first set of bits may be representative of a data set for an initial transmission to the memory device 310.

At 320, the host device 305 may transmit a first access command (e.g., a first write command) for the data set and may transmit the scrambled first set of bits. The host device 305 may transmit the first access command and the scrambled first set of bits concurrently (e.g., at partially or wholly overlapping times) or at different times. At 325, the memory device 310 may compute error detection bits (e.g., CRC bits) for the scrambled first set of bits. In some examples, the memory device 310 may compute the error detection bits as the remainder of a division of the scrambled first set of bits by a polynomial. Thus, the error detection bits computed by the memory device 310 may be based on the scrambled first set of bits.

At 330, the memory device 310 may descramble the scrambled first set of bits that is representative of the data set. For example, the memory device 310 may (e.g., via scrambling circuitry) apply a first descrambling code to the scrambled first set of bits. At 331, the memory device 310 may write the descrambled first set of bits to memory. At 333, the memory device 210 may transmit the error detection bits to the host device 305.

At 335, the host device 305 may perform an error detection procedure, such as a CRC procedure as described with reference to FIG. 2. At 340, the host device 305 may determine whether the scrambled first set of bits has been received error-free by the memory device 310. For example, the host device 305 compare a local set of error detection bits (e.g., CRC bits) for the scrambled first set of bits (e.g., computed after scrambling the first set of bits at 315) to the received error detection bits as described with reference to FIG. 2. Although FIGS. 2 and 3 are described with reference to a CRC error detection scheme, other error detection schemes, such as an error correction code (ECC) error detection scheme that uses parity bits, are within the scope of the present disclosure.

If the host device 305 determines that the scrambled first set of bits was received error-free (e.g., the local set of error detection bits are equal to the received error detection bits), the host device 305 may proceed to 380 and exit the process flow 300. However, if the host device 305 determines that the scrambled first set of bits was received with an error, the host device 305 may proceed to 345. The host device 305 may determine that the scrambled first set of bits was received with an error based on the local set of error detection bits being different than (e.g., not equal to) the received error detection bits.

At 345, the host device 305 may determine to initiate a re-write operation for the data set. The host device 305 may determine to initiate the re-write operation based on determining that the scrambled first set of bits was received with an error.

At 350, the host device 305 may change from the first scrambling code to a second scrambling code. The host device 305 may change from the first scrambling code to the second scrambling code based on determining to initiate the re-rewrite operation. At 355, the host device 305 may scramble a second set of bits. For example, the host device 305 may (e.g., via scrambling circuitry) apply the second scrambling code to the second set of bits. The second set of bits may be representative of the data set for the re-transmission to the memory device 310. In some examples, the second scrambling code may cause the host device 305 to invert the second set of bits, which may reduce complexity relative to more complex descrambling codes. However, a more complex scrambling code may provide stronger protection against transmission errors.

At 357, the host device 305 may transmit a command, which may be referred to as a query command, that prompts the memory device 210 to modify a value of the repeat flag in a register (or other component) at the memory device 310. The repeat flag may be a bit that indicates whether a received access command is for a repeat operation (e.g., a re-read operation, a re-write operation). For example, if the repeat flag has a first value, the re-repeat flag may indicate that a received access command is for a non-repeat operation. If the repeat flag has a second value, the repeat flag may indicate that a received access command is for a repeat operation. The repeat flag may be automatically cleared (e.g., reset to the first value) after a threshold duration of time has expired (e.g., relative to setting the flag) or may be cleared in response to a second command from the host device 305.

At 360, the host device 305 may transmit a second access command (e.g., a write command) and the scrambled second set of bits to the memory device 310. The host device 305 may transmit the second access command and the scrambled second set of bits concurrently (e.g., at partially or wholly overlapping times) or at different times. The second access command may be associated with the data set and may indicate a write operation. The second access command may also be referred to as a replay command, or other suitable terminology. In some examples (e.g., if the host device 305 does not transmit the command at 357), the second access command may include a flag that indicates the second access command is for a repeat operation (e.g., a re-write operation).

At 363, the memory device 310 may compute error detection bits (e.g., CRC bits) for the scrambled second set of bits. In some examples, the memory device 310 may compute the error detection bits as the remainder of a division of the scrambled second set of bits by a polynomial. Thus, the error detection bits computed by the memory device 310 may be based on the scrambled second set of bits.

At 365, the memory device 310 may determine that the second access command is for a re-write operation. In a one example (e.g., if the host device 305 transmits the command at 357), the memory device 310 may determine that the second access command is for a re-write operation based on the value of the repeat flag. In another example (e.g., if the host device 305 does not transmit the command at 357), the memory device 310 may determine that the second access command is for a re-re-write operation based on the flag included in the second access command.

At 367, the memory device 310 may change from the first scrambling code to the second scrambling code. The memory device 310 may change from the first scrambling code to the second scrambling code based on the second access command being for a re-write operation that is associated with an error in the scrambled first set of data bits. In one example (e.g., if the host device 305 does not transmit the command at 357), the memory device 310 may change scrambling codes by providing an indication of the second access command for the re-write operation to the logic gate G3 so that the control signal 209 output by the logic gate G3 causes the scrambler circuit 207 to cycle to the next scrambling code. In another example (e.g., if the host device 305 does not transmit the command at 357), the memory device 310 may change scrambling codes by asserting the control signal 209 based on the value of the repeat flag.

At 370, the memory device 310 may descramble the scrambled second set of bits that is representative of the data set. For example, the memory device 310 may (e.g., via scrambling circuitry) apply the second descrambling code to the scrambled second set of bits. Thus, the memory device 310 may use different descrambling codes for the initial transmission and the re-transmission for the data set. At 371, the memory device 310 may write the descrambled second set of bits to memory. For example, the memory device 310 may overwrite the descrambled first set of bits (previously written at 331) with the descrambled second set of bits.

At 373, the memory device 310 may transmit the error detection bits computed at 363 to the host device 305. At 375, the host device 305 may perform an error detection procedure, such as a CRC procedure. At 377, the host device 305 may determine whether the scrambled second set of bits was received error-free by the memory device 310. For example, the host device 305 may compare a local set of error detection bits (e.g., CRC bits) for the scrambled second set of bits (e.g., computed after scrambling the second set of bits at 355) to the received error detection bits.

If the host device 305 determines that the scrambled second set of bits was received error-free (e.g., the local set of error detection bits are equal to the received error detection bits), the host device 305 may proceed to 380 and exit the process flow 300. However, if the host device 305 determines that the scrambled second set of bits was received with an error, the host device 305 may proceed to 345 and repeat the operations of the process flow 300. The host device 305 may determine that the scrambled second set of bits was received without an error based on the local set of error detection bits being the same as (e.g., equal to) the received error detection bits.

Thus, the host device 305 and the memory device 310 may use of different scrambling codes for re-transmissions. If the memory device 310 receives another access command after 385, the memory device 310 may use the second descrambling code for descrambling (or scrambling) data associated with the access command if the access command is for a non-repeat operation (e.g., a non-re-read operation, a non-re-write operation). For example, the memory device 210 may use the second descrambling code if the repeat flag has the first value or if the access command has a flag (e.g., a bit) that indicates the access command is for a non-repeat operation (e.g., a non-re-read operation, a non-re-write operation).

To prevent the operations of the process flow 300 from repeating endlessly (e.g., in a loop), the host device 305 may count the quantity of times a re-write operation is performed for the same data set. If a threshold quantity of re-write operations for the same data set is performed, the host device 305 may flag the data set as having a fatal error and exit the process flow 300 (e.g., refrain from performing any addition re-write operations for the data set).

Alternative examples of the foregoing may be implemented, where some operations are performed in a different order than described, are performed in parallel (e.g., at partially or wholly overlapping times), or are not performed at all. In some cases, operations may include additional features not mentioned herein, or further operations may be added.

Figure 4:
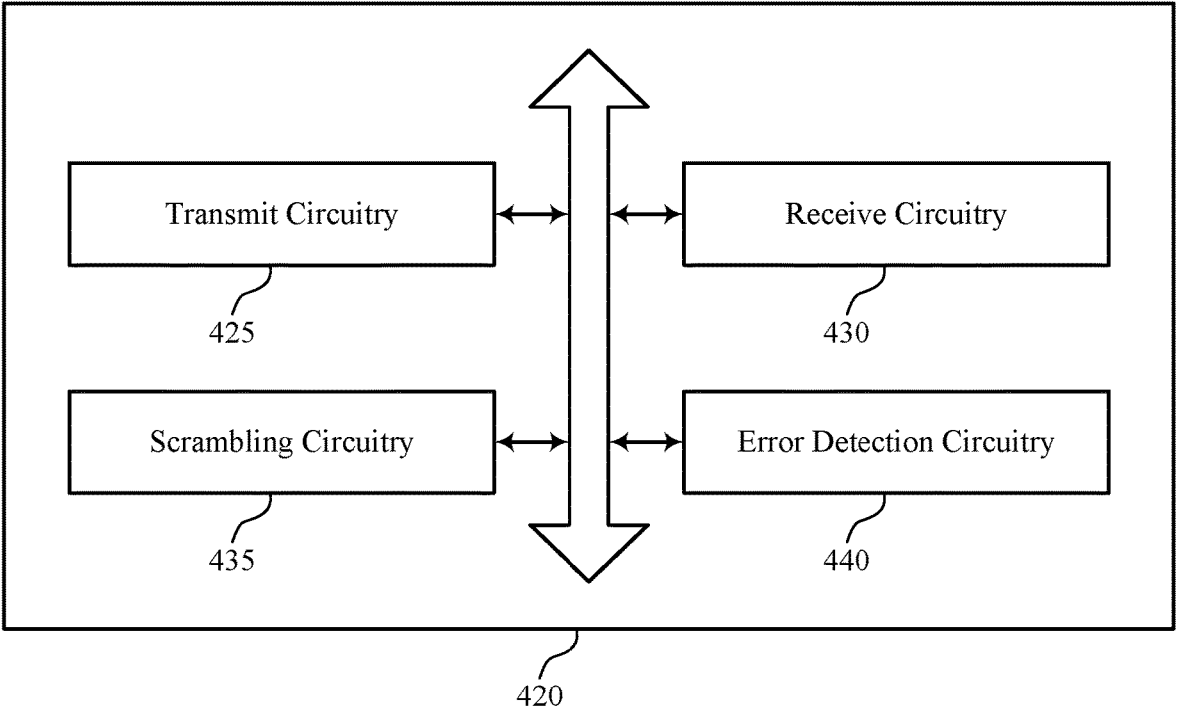
FIG. 4 shows a block diagram of a memory device that supports data scrambling for repeat operations in accordance with examples as disclosed herein.
Figure 4:

FIG. 4 shows a block diagram 400 of a memory device 420 that supports data scrambling for repeat operations in accordance with examples as disclosed herein. The memory device 420 may be an example of aspects of a memory device as described with reference to FIGS. 1 through 3. The memory device 420, or various components thereof, may be an example of means for performing various aspects of data scrambling for repeat operations as described herein. For example, the memory device 420 may include a transmit circuitry 425, a receive circuitry 430, a scrambling circuitry 435, error detection circuitry 440, or any combination thereof. Each of these components may communicate, directly or indirectly, with one another (e.g., via one or more buses). The memory device 420 may include a controller that controls the operations of one or more of the components (e.g., the controller may cause the memory device 420 to perform the operations described herein).

The transmit circuitry 425 may be configured as or otherwise support a means for transmitting a first set of bits to a host device based at least in part on a first command to read data represented by the first set of bits, the first set of bits scrambled with a first scrambling code. The receive circuitry 430 may be configured as or otherwise support a means for receiving, after transmitting the first set of bits, a second command to read the data. The scrambling circuitry 435 may be configured as or otherwise support a means for applying a second scrambling code to a second set of bits representative of the data based at least in part on an indication that the second command is for a re-read operation associated with an error in the first set of bits. In some examples, the transmit circuitry 425 may be configured as or otherwise support a means for transmitting the second set of bits to the host device after applying the second scrambling code to the second set of bits.

In some examples, the indication includes a bit in a register having a value associated with re-read operations. In some examples, the receive circuitry 430 may be configured as or otherwise support a means for receiving a command to modify the bit in the register to the value, where the command is received after the first command and before the second command.

In some examples, the receive circuitry 430 may be configured as or otherwise support a means for receiving a command to read second data. In some examples, the scrambling circuitry 435 may be configured as or otherwise support a means for applying, in response to the command, the second scrambling code to a third set of bits representative of the second data based at least in part on the bit in the register having a second value associated with non-re-read operations.

In some examples, the indication includes a bit in the second command having a value associated with re-read operations.

In some examples, the receive circuitry 430 may be configured as or otherwise support a means for receiving a command to read second data. In some examples, the transmit circuitry 425 may be configured as or otherwise support a means for applying, in response to the command, the second scrambling code to a third set of bits representative of the second data based at least in part on a bit in the command having a second value associated with non-re-read operations.

In some examples, the scrambling circuitry 435 may be configured as or otherwise support a means for changing from the first scrambling code to the second scrambling code based at least in part on the second command being for the re-read operation associated with the error in the first set of bits, where applying the second scrambling code is based at least in part on changing from the first scrambling code to the second scrambling code.

In some examples, the scrambling circuitry 435 may be configured as or otherwise support a means for applying the second scrambling code to one or more additional sets of bits after applying the second scrambling code to the second set of bits, where each set of bits of the one or more additional sets of bits is associated with a respective access command from the host device.

In some examples, the receive circuitry 430 may be configured as or otherwise support a means for receiving, after transmitting the second set of bits, a third command to read the data. In some examples, the scrambling circuitry 435 may be configured as or otherwise support a means for applying a third scrambling code to a third set of bits representative of the data based at least in part on an indication that the third command is for a second re-read operation associated with an error in the second set of bits. In some examples, the transmit circuitry 425 may be configured as or otherwise support a means for transmitting the third set of bits to the host device after applying the third scrambling code to the third set of bits.

In some examples, the error detection circuitry 440 may be configured as or otherwise support a means for determining CRC bits for the first set of bits after applying the first scrambling code. In some examples, the transmit circuitry 425 may be configured as or otherwise support a means for transmitting the CRC bits for the first set of bits, where the second command is received based at least in part on transmitting the CRC bits.

In some examples, the receive circuitry 430 may be configured as or otherwise support a means for receiving, from host device, a first set of bits representative of data and a first command to write the data. In some examples, the scrambling circuitry 435 may be configured as or otherwise support a means for applying a first descrambling code to the first set of bits. In some examples, the receive circuitry 430 may be configured as or otherwise support a means for receiving a second set of bits representative of the data and a second command to write the data. In some examples, the scrambling circuitry 435 may be configured as or otherwise support a means for applying a second descrambling code to the second set of bits based at least in part on an indication that the second command is for a re-write operation associated with an error in the first set of bits.

In some examples, the indication includes a bit in a register having a value associated with re-write operations. In some examples, the receive circuitry 430 may be configured as or otherwise support a means for receiving a command to modify the bit in the register to the value, where the command is received after the first command and before the second command. In some examples, the indication includes a bit in the second command having a value associated with re-write operations.

In some examples, the scrambling circuitry 435 may be configured as or otherwise support a means for changing from the first descrambling code to the second descrambling code based at least in part on the second command being for the re-write operation associated with the error in the first set of bits, where applying the second descrambling code is based at least in part on changing from the first descrambling code to the second descrambling code.

In some examples, the scrambling circuitry 435 may be configured as or otherwise support a means for applying the second descrambling code to one or more additional sets of bits after applying the second descrambling code to the second set of bits, where each set of bits of the one or more additional sets of bits is associated with a respective access command.

In some examples, the receive circuitry 430 may be configured as or otherwise support a means for receiving a third set of bits representative of the data and a third command to write the data. In some examples, the scrambling circuitry 435 may be configured as or otherwise support a means for applying a third scrambling code to the third set of bits based at least in part on an indication that the third command is for a re-write operation associated with an error in the second set of bits.

In some examples, the error detection circuitry 440 may be configured as or otherwise support a means for determining CRC bits for the first set of bits before applying the first descrambling code. In some examples, the transmit circuitry 425 may be configured as or otherwise support a means for transmitting the CRC bits, where the second command is received based at least in part on transmitting the CRC bits.

Figure 5:
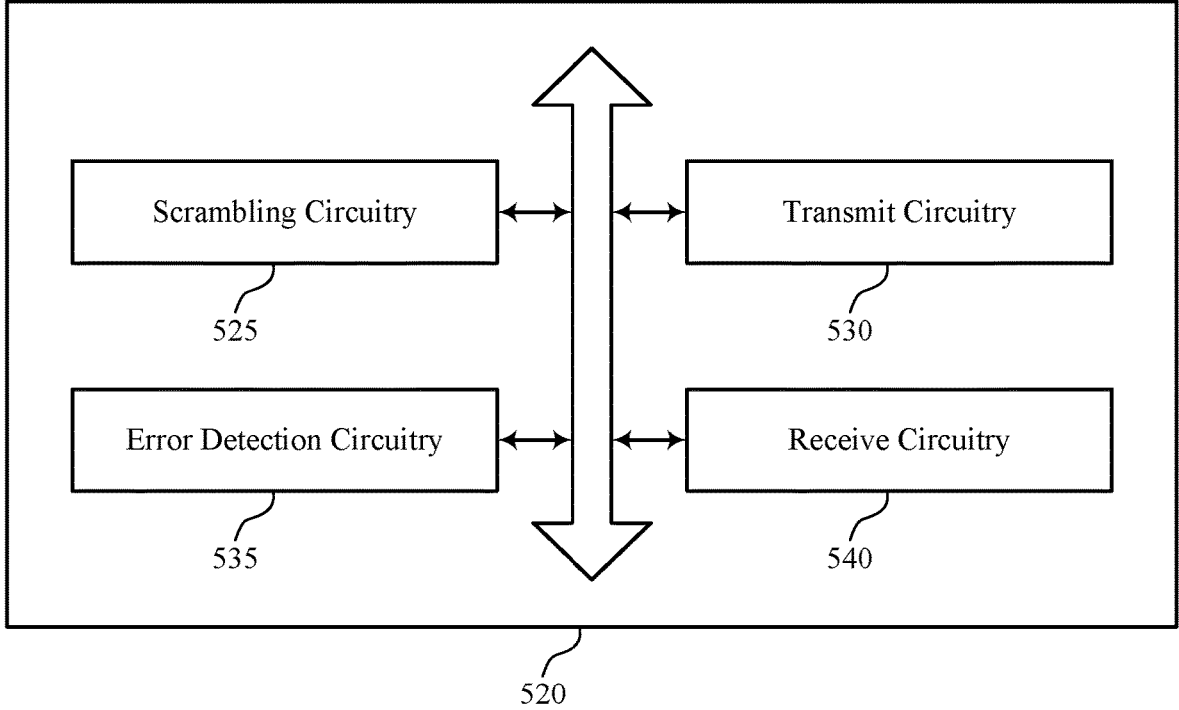
FIG. 5 shows a block diagram of a host device that supports data scrambling for repeat operations in accordance with examples as disclosed herein.

FIG. 5 shows a block diagram 500 of a host device 520 that supports data scrambling for repeat operations in accordance with examples as disclosed herein. The host device 520 may be an example of aspects of a host device as described with reference to FIGS. 1 through 3. The host device 520, or various components thereof, may be an example of means for performing various aspects of data scrambling for repeat operations as described herein. For example, the host device 520 may include a scrambling circuitry 525, a transmit circuitry 530, error detection circuitry 535, a receive circuitry 540, or any combination thereof. Each of these components may communicate, directly or indirectly, with one another (e.g., via one or more buses). The host device 520 may include a controller that controls the operations of one or more of the components (e.g., the controller may cause the host device 520 to perform the operations described herein).

The error detection circuitry 535 may be configured as or otherwise support a means for determining that a first set of bits has an error, the first set of bits representative of data associated with a first command to read the data. The transmit circuitry 530 may be configured as or otherwise support a means for transmitting, to a memory device, a second command to read the data based at least in part on determining, based at least in part on the error in the first set of bits, to initiate a re-read operation for the data. In some examples, the scrambling circuitry 525 may be configured as or otherwise support a means for changing from a first descrambling code to a second descrambling code based at least in part on the second command being for the re-read operation that is based at least in part on the error in the first set of bits. In some examples, the scrambling circuitry 525 may be configured as or otherwise support a means for applying the second descrambling code to a second set of bits representative of the data.

In some examples, the transmit circuitry 530 may be configured as or otherwise support a means for transmitting a command to modify a bit in a register of the memory device to a value associated with re-read operations, where the command is transmitted after the first command and before the second command.

In some examples, the transmit circuitry 530 may be configured as or otherwise support a means for including in the second command a bit with a value that indicates the second command is for a re-read operation.

In some examples, the scrambling circuitry 525 may be configured as or otherwise support a means for applying the second descrambling code to one or more additional sets of bits after applying the second descrambling code to the second set of bits, where each set of bits of the one or more additional sets of bits is associated with a respective access command.

In some examples, the error detection circuitry 535 may be configured as or otherwise support a means for determining that there is an error in the second set of bits. In some examples, the transmit circuitry 530 may be configured as or otherwise support a means for initiating a second re-read operation for the data based at least in part on the error in the second set of bits.

In some examples, the transmit circuitry 530 may be configured as or otherwise support a means for transmitting a third command to read the data based at least in part on initiating the second re-read operation. In some examples, the scrambling circuitry 525 may be configured as or otherwise support a means for applying a third descrambling code to a third set of bits representative of the data based at least in part on the third command being for the second re-read operation.

In some examples, the receive circuitry 540 may be configured as or otherwise support a means for receiving CRC bits for the second set of bits, where the error in the second set of bits is determined based at least in part on the CRC bits.

In some examples, the receive circuitry 540 may be configured as or otherwise support a means for receiving CRC bits for the first set of bits. In some examples, the error detection circuitry 535 may be configured as or otherwise support a means for determining that there is the error in the first set of bits based at least in part on the CRC bits.

In some examples, the transmit circuitry 530 may be configured as or otherwise support a means for transmitting, to a memory device, a first command to write data and a first set of bits representative of the data, the first set of bits scrambled with a first scrambling code. In some examples, the scrambling circuitry 525 may be configured as or otherwise support a means for applying a second scrambling code to a second set of bits representative of the data based at least in part on determining, based at least in part on an error in the first set of bits, to initiate a re-write operation for the data. In some examples, the transmit circuitry 530 may be configured as or otherwise support a means for transmitting, to the memory device after applying the second scrambling code, the second set of bits and a second command to write the data.

In some examples, the transmit circuitry 530 may be configured as or otherwise support a means for transmitting a command to modify a bit in a register of the memory device to a value associated with re-write operations, where the command is transmitted after the first command and before the second command.

In some examples, the transmit circuitry 530 may be configured as or otherwise support a means for including in the second command a bit with a value that indicates the second command is for a re-write operation.

In some examples, the scrambling circuitry 525 may be configured as or otherwise support a means for applying the second scrambling code to one or more additional sets of bits after applying the second scrambling code to the second set of bits, where each set of bits of the one or more additional sets of bits is associated with a respective access command.

In some examples, the error detection circuitry 535 may be configured as or otherwise support a means for determining that there is an error in the second set of bits. In some examples, the transmit circuitry 530 may be configured as or otherwise support a means for initiating a second re-write operation for the data based at least in part on the error in the second set of bits.

In some examples, the transmit circuitry 530 may be configured as or otherwise support a means for transmitting a third command to write the data based at least in part on determining to initiate the second re-write operation. In some examples, the scrambling circuitry 525 may be configured as or otherwise support a means for applying a third scrambling code to a third set of bits representative of the data based at least in part on the third command being for the second re-write operation.

In some examples, the error detection circuitry 535 may be configured as or otherwise support a means for determining CRC bits based at least in part on the second set of bits, where the error in the second set of bits is determined based at least in part on the CRC bits.

In some examples, the error detection circuitry 535 may be configured as or otherwise support a means for determining CRC bits based at least in part on the first set of bits, where the error in the first set of bits is determined based at least in part on the CRC bits.

FIG. 6 shows a flowchart illustrating a method 600 that supports data scrambling for repeat operations in accordance with examples as disclosed herein. The operations of method 600 may be implemented by a memory device or its components as described herein. For example, the operations of method 600 may be performed by a memory device as described with reference to FIGS. 1 through 4. In some examples, a memory device may execute a set of instructions to control the functional elements of the device to perform the described functions. Additionally or alternatively, the memory device may perform aspects of the described functions using special-purpose hardware.

At 605, the method may include transmitting a first set of bits to a host device based at least in part on a first command to read data represented by the first set of bits, the first set of bits scrambled with a first scrambling code. The operations of 605 may be performed in accordance with examples as disclosed herein. In some examples, aspects of the operations of 605 may be performed by a transmit circuitry 425 as described with reference to FIG. 4.

At 610, the method may include receiving, after transmitting the first set of bits, a second command to read the data. The operations of 610 may be performed in accordance with examples as disclosed herein. In some examples, aspects of the operations of 610 may be performed by a receive circuitry 430 as described with reference to FIG. 4.

At 615, the method may include applying a second scrambling code to a second set of bits representative of the data based at least in part on an indication that the second command is for a re-read operation associated with an error in the first set of bits. The operations of 615 may be performed in accordance with examples as disclosed herein. In some examples, aspects of the operations of 615 may be performed by a scrambling circuitry 435 as described with reference to FIG. 4.

At 620, the method may include transmitting the second set of bits to the host device after applying the second scrambling code to the second set of bits. The operations of 620 may be performed in accordance with examples as disclosed herein. In some examples, aspects of the operations of 620 may be performed by a transmit circuitry 425 as described with reference to FIG. 4.

In some examples, an apparatus as described herein may perform a method or methods, such as the method 600. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for transmitting a first set of bits to a host device based at least in part on a first command to read data represented by the first set of bits, the first set of bits scrambled with a first scrambling code; receiving, after transmitting the first set of bits, a second command to read the data; applying a second scrambling code to a second set of bits representative of the data based at least in part on an indication that the second command is for the re-read operation associated with an error in the first set of bits; and transmitting the second set of bits to the host device after applying the second scrambling code to the second set of bits.

Aspect 2: The method, apparatus, or non-transitory computer-readable medium of aspect 1 where the indication includes a bit in a register having a value associated with re-read operations.

Aspect 3: The method, apparatus, or non-transitory computer-readable medium of aspect 2, further including operations, features, circuitry, logic, means, or instructions, or any combination thereof for receiving a command to modify the bit in the register to the value, where the command is received after the first command and before the second command.

Aspect 4: The method, apparatus, or non-transitory computer-readable medium of any of aspects 2 through 3, further including operations, features, circuitry, logic, means, or instructions, or any combination thereof for receiving a command to read second data and applying, in response to the command, the second scrambling code to a third set of bits representative of the second data based at least in part on the bit in the register having a second value associated with non-re-read operations.

Aspect 5: The method, apparatus, or non-transitory computer-readable medium of any of aspects 1 through 4 where the indication includes a bit in the second command having a value associated with re-read operations.

Aspect 6: The method, apparatus, or non-transitory computer-readable medium of aspect 5, further including operations, features, circuitry, logic, means, or instructions, or any combination thereof for receiving a command to read second data and applying, in response to the command, the second scrambling code to a third set of bits representative of the second data based at least in part on a bit in the command having a second value associated with non-re-read operations.

Aspect 7: The method, apparatus, or non-transitory computer-readable medium of any of aspects 1 through 6, further including operations, features, circuitry, logic, means, or instructions, or any combination thereof for changing from the first scrambling code to the second scrambling code based at least in part on the second command being for the re-read operation associated with the error in the first set of bits, where applying the second scrambling code is based at least in part on changing from the first scrambling code to the second scrambling code.

Aspect 8: The method, apparatus, or non-transitory computer-readable medium of any of aspects 1 through 7, further including operations, features, circuitry, logic, means, or instructions, or any combination thereof for applying the second scrambling code to one or more additional sets of bits after applying the second scrambling code to the second set of bits, where each set of bits of the additional sets of bits is associated with a respective access command from the host device.

Aspect 9: The method, apparatus, or non-transitory computer-readable medium of any of aspects 1 through 8, further including operations, features, circuitry, logic, means, or instructions, or any combination thereof for receiving, after transmitting the second set of bits, a third command to read the data; applying a third scrambling code to a third set of bits representative of the data based at least in part on an indication that the third command is for a second re-read operation associated with an error in the second set of bits; and transmitting the third set of bits to the host device after applying the third scrambling code to the third set of bits.

Aspect 10: The method, apparatus, or non-transitory computer-readable medium of any of aspects 1 through 9, further including operations, features, circuitry, logic, means, or instructions, or any combination thereof for determining CRC bits for the first set of bits after applying the first scrambling code and transmitting the CRC bits for the first set of bits, where the second command is received based at least in part on transmitting the CRC bits.

FIG. 7 shows a flowchart illustrating a method 700 that supports data scrambling for repeat operations in accordance with examples as disclosed herein. The operations of method 700 may be implemented by a memory device or its components as described herein. For example, the operations of method 700 may be performed by a memory device as described with reference to FIGS. 1 through 4. In some examples, a memory device may execute a set of instructions to control the functional elements of the device to perform the described functions. Additionally or alternatively, the memory device may perform aspects of the described functions using special-purpose hardware.

At 705, the method may include receiving, from host device, a first set of bits representative of data and a first command to write the data. The operations of 705 may be performed in accordance with examples as disclosed herein. In some examples, aspects of the operations of 705 may be performed by a receive circuitry 430 as described with reference to FIG. 4.

At 710, the method may include applying a first descrambling code to the first set of bits. The operations of 710 may be performed in accordance with examples as disclosed herein. In some examples, aspects of the operations of 710 may be performed by a scrambling circuitry 435 as described with reference to FIG. 4.

At 715, the method may include receiving a second set of bits representative of the data and a second command to write the data. The operations of 715 may be performed in accordance with examples as disclosed herein. In some examples, aspects of the operations of 715 may be performed by a receive circuitry 430 as described with reference to FIG. 4.

At 720, the method may include applying a second descrambling code to the second set of bits based at least in part on an indication that the second command is for a re-write operation associated with an error in the first set of bits. The operations of 720 may be performed in accordance with examples as disclosed herein. In some examples, aspects of the operations of 720 may be performed by a scrambling circuitry 435 as described with reference to FIG. 4.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 11: A method, apparatus, or non-transitory computer-readable medium including operations, features, circuitry, logic, means, or instructions, or any combination thereof for receiving, from host device, a first set of bits representative of data and a first command to write the data; applying a first descrambling code to the first set of bits; receiving a second set of bits representative of the data and a second command to write the data; and applying a second descrambling code to the second set of bits based at least in part on an indication that the second command is for a re-write operation associated with an error in the first set of bits.

Aspect 12: The method, apparatus, or non-transitory computer-readable medium of aspect 11 where the indication includes a bit in a register having a value associated with re-write operations.

Aspect 13: The method, apparatus, or non-transitory computer-readable medium of aspect 12, further including operations, features, circuitry, logic, means, or instructions, or any combination thereof for receiving a command to modify the bit in the register to the value, where the command is received after the first command and before the second command.

Aspect 14: The method, apparatus, or non-transitory computer-readable medium of any of aspects 11 through 13 where the indication includes a bit in the second command having a value associated with re-write operations.

Aspect 15: The method, apparatus, or non-transitory computer-readable medium of any of aspects 11 through 14, further including operations, features, circuitry, logic, means, or instructions, or any combination thereof for changing from the first descrambling code to the second descrambling code based at least in part on the second command being for the re-write operation associated with the error in the first set of bits, where applying the second descrambling code is based at least in part on changing from the first descrambling code to the second descrambling code.

Aspect 16: The method, apparatus, or non-transitory computer-readable medium of any of aspects 11 through 15, further including operations, features, circuitry, logic, means, or instructions, or any combination thereof for applying the second descrambling code to one or more additional sets of bits after applying the second descrambling code to the second set of bits, where each set of bits of the additional sets of bits is associated with a respective access command.

Aspect 17: The method, apparatus, or non-transitory computer-readable medium of any of aspects 11 through 16, further including operations, features, circuitry, logic, means, or instructions, or any combination thereof for receiving a third set of bits representative of the data and a third command to write the data and applying a third scrambling code to the third set of bits based at least in part on an indication that the third command is for a re-write operation associated with an error in the second set of bits.

Aspect 18: The method, apparatus, or non-transitory computer-readable medium of any of aspects 11 through 17, further including operations, features, circuitry, logic, means, or instructions, or any combination thereof for determining CRC bits for the first set of bits before applying the first descrambling code and transmitting the CRC bits, where the second command is received based at least in part on transmitting the CRC bits.

FIG. 8 shows a flowchart illustrating a method 800 that supports data scrambling for repeat operations in accordance with examples as disclosed herein. The operations of method 800 may be implemented by a host device or its components as described herein. For example, the operations of method 800 may be performed by a host device as described with reference to FIGS. 1 through 3 and 5. In some examples, a host device may execute a set of instructions to control the functional elements of the device to perform the described functions. Additionally or alternatively, the host device may perform aspects of the described functions using special-purpose hardware.

At 805, the method may include determining that a first set of bits has an error, the first set of bits representative of data associated with a first command to read the data. The operations of 805 may be performed in accordance with examples as disclosed herein. In some examples, aspects of the operations of 805 may be performed by error detection circuitry 535 as described with reference to FIG. 5.

At 810, the method may include transmitting, to a memory device, a second command to read the data based at least in part on determining, based at least in part on the error in the first set of bits, to initiate a re-read operation for the data. The operations of 810 may be performed in accordance with examples as disclosed herein. In some examples, aspects of the operations of 810 may be performed by transmit circuitry 530 as described with reference to FIG. 5.

At 815, the method may include changing from a first descrambling code to a second descrambling code based at least in part on the second command being for the re-read operation that is based at least in part on the error in the first set of bits. The operations of 815 may be performed in accordance with examples as disclosed herein. In some examples, aspects of the operations of 815 may be performed by scrambling circuitry 525 as described with reference to FIG. 5.

At 820, the method may include applying the second descrambling code to a second set of bits representative of the data. The operations of 820 may be performed in accordance with examples as disclosed herein. In some examples, aspects of the operations of 820 may be performed by scrambling circuitry 525 as described with reference to FIG. 5

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 19: A method, apparatus, or non-transitory computer-readable medium including operations, features, circuitry, logic, means, or instructions, or any combination thereof for determining that a first set of bits has an error, the first set of bits representative of data associated with a first command to read the data; transmitting, to a memory device, a second command to read the data based at least in part on determining, based at least in part on the error in the first set of bits, to initiate a re-read operation for the data; changing from a first descrambling code to a second descrambling code based at least in part on the second command being for the re-read operation that is based at least in part on the error in the first set of bits; and applying the second descrambling code to a second set of bits representative of the data.

Aspect 20: The method, apparatus, or non-transitory computer-readable medium of aspect 19, further including operations, features, circuitry, logic, means, or instructions, or any combination thereof for transmitting a command to modify a bit in a register of the memory device to a value associated with re-read operations, where the command is transmitted after the first command and before the second command.

Aspect 21: The method, apparatus, or non-transitory computer-readable medium of any of aspects 19 through 20, further including operations, features, circuitry, logic, means, or instructions, or any combination thereof for including in the second command a bit with a value that indicates the second command is for the re-read operation.

Aspect 22: The method, apparatus, or non-transitory computer-readable medium of any of aspects 19 through 21, further including operations, features, circuitry, logic, means, or instructions, or any combination thereof for applying the second descrambling code to one or more additional sets of bits after applying the second descrambling code to the second set of bits, where each set of bits of the additional sets of bits is associated with a respective access command.

Aspect 23: The method, apparatus, or non-transitory computer-readable medium of any of aspects 19 through 22, further including operations, features, circuitry, logic, means, or instructions, or any combination thereof for determining that there is an error in the second set of bits and initiating a second re-read operation for the data based at least in part on the error in the second set of bits.

Aspect 24: The method, apparatus, or non-transitory computer-readable medium of aspect 23, further including operations, features, circuitry, logic, means, or instructions, or any combination thereof for transmitting a third command to read the data based at least in part on initiating the second re-read operation and applying a third descrambling code to a third set of bits representative of the data based at least in part on the third command being for the second re-read operation.

Aspect 25: The method, apparatus, or non-transitory computer-readable medium of any of aspects 23 through 24, further including operations, features, circuitry, logic, means, or instructions, or any combination thereof for receiving CRC bits for the second set of bits, where the error in the second set of bits is determined based at least in part on the CRC bits.

Aspect 26: The method, apparatus, or non-transitory computer-readable medium of any of aspects 19 through 25, further including operations, features, circuitry, logic, means, or instructions, or any combination thereof for receiving CRC bits for the first set of bits and determining that there is the error in the first set of bits based at least in part on the CRC bits.

FIG. 9 shows a flowchart illustrating a method 900 that supports data scrambling for repeat operations in accordance with examples as disclosed herein. The operations of method 900 may be implemented by a host device or its components as described herein. For example, the operations of method 900 may be performed by a host device as described with reference to FIGS. 1 through 3 and 5. In some examples, a host device may execute a set of instructions to control the functional elements of the device to perform the described functions. Additionally or alternatively, the host device may perform aspects of the described functions using special-purpose hardware.

At 905, the method may include transmitting, to a memory device, a first command to write data and a first set of bits representative of the data, the first set of bits scrambled with a first scrambling code. The operations of 905 may be performed in accordance with examples as disclosed herein. In some examples, aspects of the operations of 905 may be performed by a transmit circuitry 530 as described with reference to FIG. 5.

At 910, the method may include applying a second scrambling code to a second set of bits representative of the data based at least in part on determining, based at least in part on an error in the first set of bits, to initiate a re-write operation for the data. The operations of 910 may be performed in accordance with examples as disclosed herein.

In some examples, aspects of the operations of 910 may be performed by a scrambling circuitry 525 as described with reference to FIG. 5.

At 915, the method may include transmitting, to the memory device after applying the second scrambling code, the second set of bits and a second command to write the data. The operations of 915 may be performed in accordance with examples as disclosed herein. In some examples, aspects of the operations of 915 may be performed by a transmit circuitry 530 as described with reference to FIG. 5.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 27: A method, apparatus, or non-transitory computer-readable medium including operations, features, circuitry, logic, means, or instructions, or any combination thereof for transmitting, to a memory device, a first command to write data and a first set of bits representative of the data, the first set of bits scrambled with a first scrambling code; applying a second scrambling code to a second set of bits representative of the data based at least in part on determining, based at least in part on an error in the first set of bits, to initiate a re-write operation for the data; and transmitting, to the memory device after applying the second scrambling code, the second set of bits and a second command to write the data.

Aspect 28: The method, apparatus, or non-transitory computer-readable medium of aspect 27, further including operations, features, circuitry, logic, means, or instructions, or any combination thereof for transmitting a command to modify a bit in a register of the memory device to a value associated with re-write operations, where the command is transmitted after the first command and before the second command.

Aspect 29: The method, apparatus, or non-transitory computer-readable medium of any of aspects 27 through 28, further including operations, features, circuitry, logic, means, or instructions, or any combination thereof for including in the second command a bit with a value that indicates the second command is for a re-write operation.

Aspect 30: The method, apparatus, or non-transitory computer-readable medium of any of aspects 27 through 29, further including operations, features, circuitry, logic, means, or instructions, or any combination thereof for applying the second scrambling code to one or more additional sets of bits after applying the second scrambling code to the second set of bits, where each set of bits of the additional sets of bits is associated with a respective access command.

Aspect 31: The method, apparatus, or non-transitory computer-readable medium of any of aspects 27 through 30, further including operations, features, circuitry, logic, means, or instructions, or any combination thereof for determining that there is an error in the second set of bits and initiating a second re-write operation for the data based at least in part on the error in the second set of bits.

Aspect 32: The method, apparatus, or non-transitory computer-readable medium of aspect 31, further including operations, features, circuitry, logic, means, or instructions, or any combination thereof for transmitting a third command to write the data based at least in part on determining to initiate the second re-write operation and applying a third scrambling code to a third set of bits representative of the data based at least in part on the third command being for the second re-write operation.

Aspect 33: The method, apparatus, or non-transitory computer-readable medium of any of aspects 31 through 32, further including operations, features, circuitry, logic, means, or instructions, or any combination thereof for determining CRC bits based at least in part on the second set of bits, where the error in the second set of bits is determined based at least in part on the CRC bits.

Aspect 34: The method, apparatus, or non-transitory computer-readable medium of any of aspects 27 through 33, further including operations, features, circuitry, logic, means, or instructions, or any combination thereof for determining CRC bits based at least in part on the first set of bits, where the error in the first set of bits is determined based at least in part on the CRC bits.

It should be noted that the methods described herein describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

As used herein, the term "substantially" means that the modified characteristic (e.g., a verb or adjective modified by the term substantially) need not be absolute but is close enough to achieve the advantages of the characteristic.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
transmitting, over a bus, a first set of bits to a host device based at least in part on a first command to read data represented by the first set of bits, the first set of bits scrambled with a first scrambling code;
receiving, after transmitting the first set of bits, a second command to read the data;
applying a second scrambling code to a second set of bits representative of the data based at least in part on an indication that the second command is for a re-read operation associated with an error in the first set of bits; and
transmitting, over the bus, the second set of bits to the host device after applying the second scrambling code to the second set of bits.

2. The method of claim 1, wherein the indication comprises a bit in a register having a value associated with re-read operations.

3. The method of claim 2, further comprising:
receiving a command to modify the bit in the register to the value, wherein the command is received after the first command and before the second command.

4. The method of claim 2, further comprising:
receiving a command to read second data; and
applying, in response to the command, the second scrambling code to a third set of bits representative of the second data based at least in part on the bit in the register having a second value associated with non-re-read operations.

5. The method of claim 1, wherein the indication comprises a bit in the second command having a value associated with re-read operations.

6. The method of claim 5, further comprising:
receiving a command to read second data; and
applying, in response to the command, the second scrambling code to a third set of bits representative of the second data based at least in part on a bit in the command having a second value associated with non-re-read operations.

7. The method of claim 1, further comprising:
applying the second scrambling code to one or more additional sets of bits after applying the second scrambling code to the second set of bits, wherein each set of bits of the one or more additional sets of bits is associated with a respective access command from the host device.

8. The method of claim 1, further comprising:
receiving, after transmitting the second set of bits, a third command to read the data;

applying a third scrambling code to a third set of bits representative of the data based at least in part on an indication that the third command is for a second re-read operation associated with an error in the second set of bits; and
transmitting the third set of bits to the host device after applying the third scrambling code to the third set of bits.

9. The method of claim 1, further comprising:
determining cyclic redundancy check (CRC) bits for the first set of bits after applying the first scrambling code; and
transmitting the CRC bits for the first set of bits, wherein the second command is received based at least in part on transmitting the CRC bits.

10. A method, comprising:
receiving, from a host device over a bus, a first set of bits representative of data and a first command to write the data;
applying a first descrambling code to the first set of bits;
receiving, over the bus, a second set of bits representative of the data and a second command to write the data; and
applying a second descrambling code to the second set of bits based at least in part on an indication that the second command is for a re-write operation associated with an error in the first set of bits.

11. The method of claim 10, wherein the indication comprises a bit in a register having a value associated with re-write operations.

12. The method of claim 11, further comprising:
receiving a command to modify the bit in the register to the value, wherein the command is received after the first command and before the second command.

13. The method of claim 10, wherein the indication comprises a bit in the second command having a value associated with re-write operations.

14. The method of claim 10, further comprising:
applying the second descrambling code to one or more additional sets of bits after applying the second descrambling code to the second set of bits, wherein each set of bits of the one or more additional sets of bits is associated with a respective access command.

15. The method of claim 10, further comprising:
receiving a third set of bits representative of the data and a third command to write the data; and
applying a third scrambling code to the third set of bits based at least in part on an indication that the third command is for a re-write operation associated with an error in the second set of bits.

16. The method of claim 10, further comprising:
determining cyclic redundancy check (CRC) bits for the first set of bits before applying the first descrambling code; and
transmitting the CRC bits, wherein the second command is received based at least in part on transmitting the CRC bits.

17. A method, comprising:
determining that a first set of bits received over a bus has an error, the first set of bits representative of data associated with a first command to read the data;
transmitting, to a memory device, a second command to read the data based at least in part on determining, based at least in part on the error in the first set of bits, to initiate a re-read operation for the data;
changing from a first descrambling code to a second descrambling code based at least in part on the second command being for the re-read operation that is based at least in part on the error in the first set of bits; and applying the second descrambling code to a second set of bits representative of the data received over the bus.

18. The method of claim 17, further comprising:

transmitting a command to modify a bit in a register of the memory device to a value associated with re-read operations, wherein the command is transmitted after the first command and before the second command.

\* \* \* \* \*